United States Patent

Imanishi et al.

Patent Number: 5,862,286
Date of Patent: Jan. 19, 1999

[54] OPTICAL MEMORY DEVICE AND OPTICAL CIRCUIT USING OPTICAL MEMORY DEVICE

[75] Inventors: Yasuo Imanishi; Shingo Ishihara; Tomoyuki Hamada, all of Hitachi; Atsushi Kakuta, Hitachiota, all of Japan

[73] Assignee: Hitachi, Ltd., Tokyo, Japan

[21] Appl. No.: 502,916

[22] Filed: Jun. 28, 1995

[30] Foreign Application Priority Data

Jun. 30, 1994 [JP] Japan .................................. 6-148974

[51] Int. Cl.$^6$ .................................................. G11C 13/04
[52] U.S. Cl. ........................ 385/122; 359/241; 359/326; 365/64; 365/106; 385/24
[58] Field of Search ................................. 385/15, 24, 27, 385/122; 359/238, 240, 241, 243, 244, 326–332; 365/64, 106, 119, 129, 151

[56] References Cited

U.S. PATENT DOCUMENTS

| | | | |
|---|---|---|---|
| 4,738,503 | 4/1988 | Desurvire et al. | 385/122 X |
| 5,268,862 | 12/1993 | Rentzepis | 365/151 |
| 5,349,464 | 9/1994 | Ishihara et al. | 359/240 |
| 5,400,173 | 3/1995 | Komine | 359/330 |
| 5,472,759 | 12/1995 | Chen et al. | 428/65.1 |
| 5,493,628 | 2/1996 | Lawandy | 385/122 |
| 5,533,154 | 7/1996 | Smith | 385/27 |
| 5,566,261 | 10/1996 | Hall et al. | 385/27 |
| 5,684,621 | 11/1997 | Downing | 359/326 |

FOREIGN PATENT DOCUMENTS

| | | |
|---|---|---|
| 62-139529A | 6/1987 | Japan . |
| 2-77031A | 3/1990 | Japan . |
| 2-77034A | 3/1990 | Japan . |
| 2-77035A | 3/1990 | Japan . |

OTHER PUBLICATIONS

Conference Report: CLEO/QELS' 93 Report III (see Specification p. 2), pp. 78–93, Kaneko et al, 1993. [No Month].
Non–Linear Electronics, Takao Hushimi 1992, p. 208 [No Month].

Primary Examiner—John D. Lee
Attorney, Agent, or Firm—Kenyon & Kenyon

[57] ABSTRACT

An optical memory device having at least two nonlinear optical media connected together by at least two light paths. This optical memory device can make high-speed light pulse signal processing which cannot be realized by the conventional electric switch.

12 Claims, 9 Drawing Sheets

FIG.9
| LOGIC | LOGIC CIRCUIT | LOGIC TABLE |
|---|---|---|
| "A (YES)" | 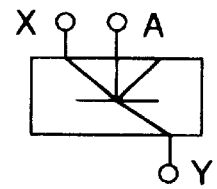 | A Y<br>0 0<br>1 1 |
| "NOT A (NOT)" | 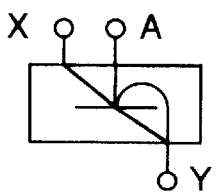 | A Y<br>0 1<br>1 0 |
| "A or B (SUM)" | 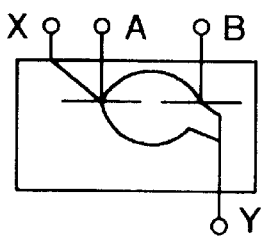 | A B Y<br>0 0 0<br>0 1 1<br>1 0 1<br>1 1 1 |
| "B if A (CARRY)" | 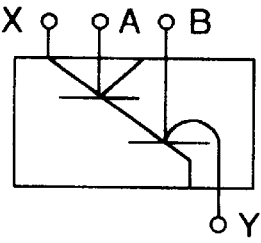 | A B Y<br>0 0 1<br>0 1 0<br>1 0 0<br>1 1 1 |
| "A and B (PRODUCT)" | 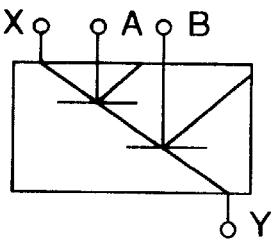 | A B Y<br>0 0 0<br>0 1 0<br>1 0 0<br>1 1 1 |

OPTICAL MEMORY DEVICE AND OPTICAL CIRCUIT USING OPTICAL MEMORY DEVICE

BACKGROUND OF THE INVENTION

The present invention relates to a high-speed optical memory device and an optical circuit using this device. Particularly, this device is used for an optical temporary memory device, light clock and optical operator in for the fields of the next-generation multimedia communications, and optical signal communications such as microprocessor interconnection and optical computer.

The demand for large-capacity bidirectional communication network has been recently increased and is now steadily growing. In addition, the means for the transmission of information among more people is going to be developed and ready for use on a national scale as a social capital to be prepared in the twenty-first century. In order to build up this basic technology for the new century, it is necessary to use information processing techniques by which a large quantity of bidirectional information can be processed at higher speed. A part of the conventional electronics has evolved to optoelectronics for optical technology and is steadily expanding to photonics for optical technology to all. In this optical information processing and communication, it is important to increase the speed of signal processing and the amount of signal to be processed per unit time.

According to a document of, for example, "Semiconductor Laser, Light Communication and Optical Device", Conference Report:ClEO/QELS, '93 Report III, by Yawara Kaneko, et al., the trend of recent light communication toward great increase of the amount of information to be processed can be divided into the following two types.

The first type is the wavelength division multiplexing (WDM) system, or optical frequency division multiplexing, in which light of a different wavelength is mixed in a light pulse of several microseconds through several nanoseconds, thereby to increase the amount of information per pulse.

In this system, a light signal is generated by swiftly changing the oscillation frequency of a semiconductor laser to comply with an electrical signal which is desired to be transmitted. In addition, the light path through which this light signal is transmitted is changed chiefly by an optical device using electrooptical effect. Therefore, the response time of optical media necessary for the modulation of light pulse depends on the processing time in electric signal circuits, and hence the optical device can be made of an existing semiconductor material of silicon or germanium.

However, since light rays of different wavelengths on a single pulse are transmitted over a long distance, the light signal waveform is disturbed by group velocity dispersion and the light amplification in a repeater base station becomes irregular. Thus, there is a limitation in the maximum amount of signals which can be multiplexed.

Therefore, a time division multiplex system for transmitting and receiving shorter light pulses at high speed has been investigated as the second type for processing a large amount of information per unit time. In this system, since short light pulses of several picoseconds are successively transmitted at constant intervals of time as a train of light pulses of light signal, there are no such waveform disturbance and irregular light amplification as in the wavelength division multiplexing system mentioned above. In addition, since digital signals can be easily processed, a large amount of signals can be correctly transmitted over a long distance at high speed without any error in reading.

In order that this system can be practically used, it is necessary to use optical devices such as higher-speed light signal generators, light-path switchers and light signal readouts, and an optical system in which these devices are arranged in parallel at high density to operate in synchronism with each other. In addition, these fundamental optical devices depend on optical media with a high-speed response.

These optical media can be achieved not by silicon used so far of which the response speed to light pulse is as slow as at most several nanoseconds, but by a low dimensional system material such as of semiconductor superlattice gallium arsenide of which the response speed is as high as a value from several hundred picoseconds to several tens of picoseconds. In addition, faster response media of several picoseconds or below have been realized by use of conjugated system organic compound such as polydiacetylene. New optical devices can be expected to be produced by the development of the technology for the amount of driving light and establishment of process.

This fast response characteristic is closely related to the nonlinear optical effect of substance. The nonlinear optical effect is the phenomenon that when intense light such as laser beam is irradiated on a substance, electronic polarization occurs within the substance in proportion to a high-order power, such as square and cube, of electric field intensity of light. The fast response characteristic due to the nonlinear optical effect of substance is achieved by the change of charge distribution within the substance irradiated with laser beam and the rapid generation of new polarization. In other words, if the electric field intensity of incident light and induced polarization of substance are represented by E and P, respectively, the relation between both can be given by the following equation:

$$P = x1E + x2E^2 + x3E^3 + \ldots$$

where $\chi^{(1)}, \chi^{(2)}, \chi^{(3)} \ldots$ are coefficients called first-, second-, third-, . . . order electric susceptibility, respectively. The effect associated with the second-order term and above is called the nonlinear optical effect. Since the coefficients are normally decreased with the increase of the order number, the effect cannot be confirmed without intense light beam. The nonlinear optical effect due to the even-order, or second-order, fourth- order, coefficients does not occur in center-symmetrical substance such as glass fiber because induced polarization is canceled out when the polarization units of atoms and molecules themselves of a substance and the arrangement thereof within the substance are symmetric with respect to the center. As a result of this polarization, new light is generated of which the frequency is different from that of the incident light, and the refractive index and absorption coefficient of the substance are changed in proportion to the amount of incident light.

In practice, the effect associated with optical switch is the third-order nonlinear susceptibility. The amount of incident light necessary to make the substance function activated can be decreased with the increase of the sensitivity value. In other words, if the refractive index of a substance before being irradiated, the amount of incident light and the refractive index at the time of being irradiated are $n_0$, I and n, respectively, the relation among them can be expressed by the following equation:

$$n = n_0 + n_2 I$$

where $n_2$ is the nonlinear refractive index, and can be expressed in the unit of $cm^2/W$ by the third-order nonlinear sensitivity $\chi^{(3)}$ (esu unit) and the following equation.

$n_2 = 1.6 \times 10^8 \pi^2 \times 3 / c n_0^2$

The light passing through the substance can be switched from a light path to another, modulated and shut off by changing the refractive index, reflection angle, transmissivity and reflectance. Since this polarization remains within the substance until it is extinguished by light or heat, a fast-speed optical switch must be made of a material of which the polarization is swiftly extinguished immediately after the incident light is passed therethrough. This effect is increased with the increase of the amount of incident light as shown by the above equations. Thus, when part of the light transmitting through the substance is again incident to the substance or when a resonator mirror is mounted on the substance, to increase the amount of light within the substance by feedback and arrive at the extent that it exceeds a particular threshold, the light within the substance is increased so that an extreme switching effect appears. Conversely, when the incident light is gradually decreased after the optical switch is operated by a constant value of light and again arrives at the extent that it is less than the threshold, the light passing through the substance is suddenly decreased.

The presence of these two definite states of passing light bisected by the threshold is called the optical bistability. When these low transmissivity and high transmissivity in this optical bistability are used as the on-state and off-state, respectively, the two states can be switched at high speed by changing the amount of incident light. In other words, the substance of an optical bistable switch using the third-order nonlinear optical effect fundamentally depends on the sum of the third-order nonlinear optical susceptibity and light polarization. The on and off states can be more sensitively made with the increase of nonlinear refractive index $n_2$. Also, the optical switch using the optical bistability phenomenon can be driven at high speed by the increase of the speed at which the polarization once established by light is extinguished. In the signal transmission processing system using actual light, since the switch is driven by a small amount of signal light, it is necessary that constant bias light be added to bring the operating point to around the threshold so that the amount of all input light is changed at around the threshold in accordance with the presence or absence of signal light.

As described above, the optical bistable switch using the third-order nonlinear optical effect is able to make high speed operation which could not be made by the conventional electric switch, and thus it is increasingly expected to be used for the large-capacity high-speed light communication in the next generation.

However, in the actual optical information processing system, so far the first information generation is made by a computer chiefly of conventional electronic circuits, and the signal is converted into optical pulses, or converted from electric signal to light signal, by a semiconductor light-emitting device and then transmitted through an optical fiber. Therefore, for large-amount light communication, it is necessary to connect a large number of electrooptical transducers in parallel and concentrate all the light from those transducers into a single optical fiber. In order that the light signals from the separate electrooptical transducers can be regularly arranged to be parallel, it is necessary to exchange constant synchronizing signals among the transducers. In addition, when short light pulses are treated, the synchronizing means must have the same precision as that of the pulse duration.

Moreover, not only in the simple light path switching using the above-mentioned optical switch, but also in various different light signal processing operations such as logic sum by use of a combination of a plurality of optical switches, it is required to provide means for synchronizing the operations of the optical switches. In other words, a special optical memory function is necessary to hold the light signals at the respective devices for a constant time and regularly transmit in synchronism with a reference clock signal.

The above-given optical bistable switch can be turned on by applying a light signal to exceed the threshold, but cannot be swiftly turned off at an arbitrary time. In other words, when the optical bistable switch is operated without bias light, it returns to the off-state after the signal light has been completely passed through the switch. Thus, it has no memory means. In addition, when the bistable switch is operated with bias light, the bias light itself is required to be once stopped at high speed. Therefore, the light source, or semiconductor laser itself must be turned on and off at high speed, and it cannot be operated at a high speed of picoseconds or below.

In addition, although the synchronization among a plurality of transducers has so far been controlled by an electric signal, it cannot be controlled at super high speed by a light pulse of several picoseconds or below. Thus, light communication cannot be performed which transmits super short light pulses at high density.

Moreover, a huge laser system must be provided in order to generate light pulses of the order of picoseconds or below necessary for the control by super high speed light signal, and there are no simple generator means.

SUMMARY OF THE INVENTION

It is an object of the invention to provide an optical memory device capable of solving the above problems and which is necessary for the high-speed light pulse signal processing.

It is another object of the invention to provide a light signal processing system such as optical circuits, a large-capacity light transmitter and receiver, an optical temporary memory and optical arithmetic operator which use the optical memory device of this invention.

According to the present invention, as the first means there is provided an optical memory device having at least two nonlinear optical media connected together by at least two light paths.

According to the present invention, as the second means there is provided an optical memory device having at least two nonlinear optical media connected together by at least two light paths, the light paths including:

a light path A through which driving light is incident to the optical memory device to drive it;

a light path B through which information light is incident to the optical memory device;

a light path C through which information reading light is incident to the optical memory device to read written information from the memory device; and a light path D through which light of read information exits, all the light paths A, B, C and D being not connected to one of the nonlinear optical media.

According to the invention, as the third means there is provided an optical memory device having at least two nonlinear optical media connected together by at least two light paths, the light paths including:

a light path A through which driving light is incident to the optical memory device to drive it;

a light path B through which information light is incident to the optical memory device;

a light path C through which information reading light is incident to the optical memory device to read written information from the memory device; and a light path D through which light of read information exits, light-amount variable light being incident to at least one of these light paths A, B, C and D.

According to the invention, as the fourth means there is provided an optical memory device having at least two nonlinear optical media connected together by at least two light paths, wherein the light path A through which driving light is incident to the optical memory device and the light path B through which information light is incident to the optical memory device are connected to at least one nonlinear optical medium E, and the light path C through which information reading light is incident to the optical memory device to read written information from the memory device and the light path D through which light of read information exits are connected to a nonlinear optical medium F different from the nonlinear optical medium E.

According to the invention, as the fifth means there is provided an optical memory device having at least two nonlinear optical media connected together by at least two light paths, the light paths including:

a light path through which the driving light incident to at least one nonlinear optical medium E to drive the optical memory device and exiting from the nonlinear optical medium E is incident to another nonlinear optical medium F different from the nonlinear optical medium E; and a light path through which the light incident to the nonlinear optical medium F and exiting from the nonlinear optical medium F is incident to the nonlinear optical medium E.

According to the invention, as the sixth means there is provided an optical memory device having at least two nonlinear optical media connected together by at least two light paths, wherein the nonlinear optical media exhibit optical bistability, and if the threshold of one nonlinear optical medium E is represented by $I_{c1}$, the threshold of another nonlinear optical medium F by $I_{c2}$, the amount of information light incident to the nonlinear optical medium E of the optical memory device by $I_{set}$, the amount of driving light incident to the nonlinear optical medium E of the optical memory device by $I_{source}$, the amount of light exiting from the medium E and then incident to the nonlinear optical medium F by $I_{source\ 1}$, the amount of light incident to the nonlinear optical medium F, exiting from the medium F and then incident to the nonlinear optical medium E by $I_{source\ 2}$, and the amount of reading light incident to the nonlinear optical medium F to read the written information from the optical memory device by $I_{reset}$, the following equations (1) through (7) can be established:

$$I_{c1} > I_{source} \quad (1)$$
$$I_{c1} > I_{set}, I_{c1} > I_{source\ 2} \quad (2)$$
$$I_{source} + I_{set} \geq I_{c1} \quad (3)$$
$$I_{source} + I_{source\ 2} \geq I_{c1} \quad (4)$$
$$I_{c2} > I_{source\ 1} \quad (5)$$
$$I_{c2} > I_{reset} \quad (6)$$
$$I_{source} + I_{reset} \geq I_{c2} \quad (7)$$

According to the invention, as the seventh means there is provided an optical memory device according to any one of the first through sixth means of the invention, wherein the length of the light paths connecting the nonlinear optical media is one meter or below.

According to the invention, as the eighth means there is provided an optical memory device according to any one of the first through seventh means, wherein the length of the light paths connecting the nonlinear optical media is variable.

According to the invention, as the ninth means there is provided an optical circuit including at least two optical memory devices according to any one of the first through eighth means.

According to the invention, as the tenth means there is provided an optical circuit including at least two optical memory devices according to any one of the first through eighth means, the optical memory devices being connected by light paths.

According to the invention, as the eleventh means there is provided an optical circuit including at least two optical memory devices according to any one of the first through eighth means, the optical memory devices being started to operate, written, read and erased about information by movable light sources.

According to the invention, as the twelfth means there is provided an optical circuit having a plurality of optical memory devices according to any one of the first through eighth means formed on a single substrate.

According to the invention, as the thirteenth means there is provided an optical transmitter having a device for converting at least two external electric signals into light signals, an optical memory device according to any one of the first through eighth means to temporarily store the light signals, and a device for mixing light signals which are synchronously read from the optical memory device and supplying them to the outside.

According to the invention, as the fourteenth means there is provided an optical receiver having a device for dividing an external light signal train into at least two light signals, an optical memory device according to any one of the first through eighth means to temporarily store the light signals, and a device for converting light signals synchronously read from the optical memory device into electrical signals and supplying them to the outside.

According to the invention, as the fifteenth means there is provided an optical computer having an optical memory device according to any one of the first through eighth means and an optical logic operator.

According to the invention, as the sixteenth means there is provided a display device having an optical memory device according to any one of the first through eighth means, and a light-emitting device The light paths in this invention are the light paths through which light rays are propagated directly or by way of a mirror, an optical waveguide or the like between two different nonlinear optical media.

The threshold of the nonlinear optical medium exhibiting optical bistability in this invention is the quantity of light in the case where when the amount of incident light to the optical bistable medium included in the optical memory device is smaller and larger than that quantity of light, the amount of light passing through or reflecting from the nonlinear optical medium is suddenly increased. In addition, a necessary number of auxiliary bias light rays may be used in order to operate the optical memory device.

The materials which can be used to produce nonlinear optical media for optical memory devices of the invention may be such organic substances as glass, crystal, diamond, silicon dioxide, mica, marble, calcite, single crystal silicon, noncrystal silicon, GaAs, CdS, KDP, KTP, lithium niobate, potassium bromide, Rochelle salt, copper sulfate, calcium fluoride, graphite, tin dioxide, barium titanate, hekisa-siano-iron salt, red prussiate of potask porcelain, ceramic, bentonite, and cement, metal and alloy.

In addition, organic substances which can be used to produce nonlinear optical media for optical memory devices of the invention may be polycarbonate, polysulfone, polyarylate, polyester, polyamide, polyimide, polysiloxane, polyethylene terephthalate, polyvinyl acetate, polyethylene, polypropylene, acrylic resin, polybutadiene, polyvinyl chloride, polyvinylidene chloride, petroleum resin, melamine resin, epoxy resin, phenol resin, isoprene rubber, ethylene-propylene rubber, norbonene resin, cyanoacrylate resin, styrene resin and copolymer of these resin materials, or cellulose, starch, chitin, agar, silk thread, cotton thread, nylon thread, albumin, globulin and other proteins, woody materials, powdered bones, and such low-molecular organic substances as condensed aromatic compounds of naphthalene and anthracene or the like, dye, pigment, urea, tartaric acid, and optically active amino acid. Moreover, the following substances may be used: second-order conjugated molecules chiefly of aromatic compounds such as benzene, naphthalene, anthracene, tetracene, pentacene, phenantlene, pyrene, and perilene, primary condugated molecules or polymer of ethylene, propylene, butadiene, acetylene and diacetylene, third-order conjugated molecules of fullerane derivative of, for example, $C_{60}$ or $C_{70}$, and carbon nanotube, complex ring conjugated molecules of tetrathiafluvarene, tetracyano quinodimethane, quinoline, acridine, benzoquinone, naphthoquinone, organic compounds fundamentally made of organometallic compounds of, for example, porphyrin, phthalocyanine and ferrocene, derivatives produced by adding to such organic compounds various substituents of nitro group, cyano group, carboxylic acid group, aldehyde group, acetyl group, chloro group, bromo group, fluoro group, methylamino group, methyl group, methoxyl group, hydroxy group and amino group.

The nonlinear optical media of the optical memory device of the invention can be produced by thin film technology using dry process such as vacuum evaporation and MOCVD (Metalorganic Chemical Vapor Deposition), thin film technology using wet process such as spin coating, liquid-phase epitaxial deposition, electric field polymerization and LB (Langmuir-Blodgett), or by using various single crystals, resin moldings, powder moldings and other processed materials.

The nonlinear optical media of the optical memory device of the invention, after being produced, can be used exactly as they are or after further adding a proper dopant to the product and shaping it to be lumps, flat plates, fibers, powder or thin films. In addition, the nonlinear media of such shape can be combined or mixed with other different materials or materials different from the structure of the invention.

After the nonlinear optical media of the optical memory device of the invention are produced, they may be further processed for the outward appearance, improvement of characteristics and extension of life. The after-treatment may be heat annealing, irradiation of radiation, electron beam, light rays, radio waves, magnetic force lines and ultrasonic waves, and coating for dielectric multilayered mirror or partially reflecting mirror, though not particularly limited to those processes.

For the production of the optical memory device of the invention, nonlinear optical media are optically arranged, attached with mirrors, connected with optical waveguides or formed on a substrate to integrate by lithography. In addition, the nonlinear optical media may be combined with a mechanism for adjusting their positions or the polarization, deflection or wavelengths of propagating light rays or may be sealed with resin. Moreover, optical memory devices according to this invention may be combined to form a system operating in synchronism with a light ray or other signals, integrated or indivisually coupled by optical fibers.

Particularly, the optical memory devices of the invention can be applied to, for example, optical mixers, optical phase discriminators, optical cables, light modulators, light deflectors, optical selective waveplate, phase conjugate mirrors, optical switches, light-emitting devices, laser, optoelectronic transducers, optoacoustic transducers, piezoelectric elements, optical logic elements, optical integrated circuits, and display elements.

According to this invention, it is possible to produce an ultrahigh-speed optical memory device which cannot be achieved by the conventional optical bistable element. Also, it is possible to produce high-speed large-capacity light information processing and transmitting means by combining optical memory devices of the invention, which cannot be achieved by the conventional electric signal processing. Furthermore, an optical temporarily storing hold circuit necessary for logic operations in optical computers or others by integrating the optical memory devices of the invention.

BRIEF DESCRIPTION OF THE DRAWINGS

FIG. 9 shows the logic operating circuits of the optical logic operating device using optical memory devices of the invention and the logic operation tables.

DESCRIPTION OF THE PREFERRED EMBODIMENTS

Embodiment 1

First, an experimental method will be described which is useful to confirm the operation of an optical memory device using a plurality of nonlinear optical media.

Figure 1:
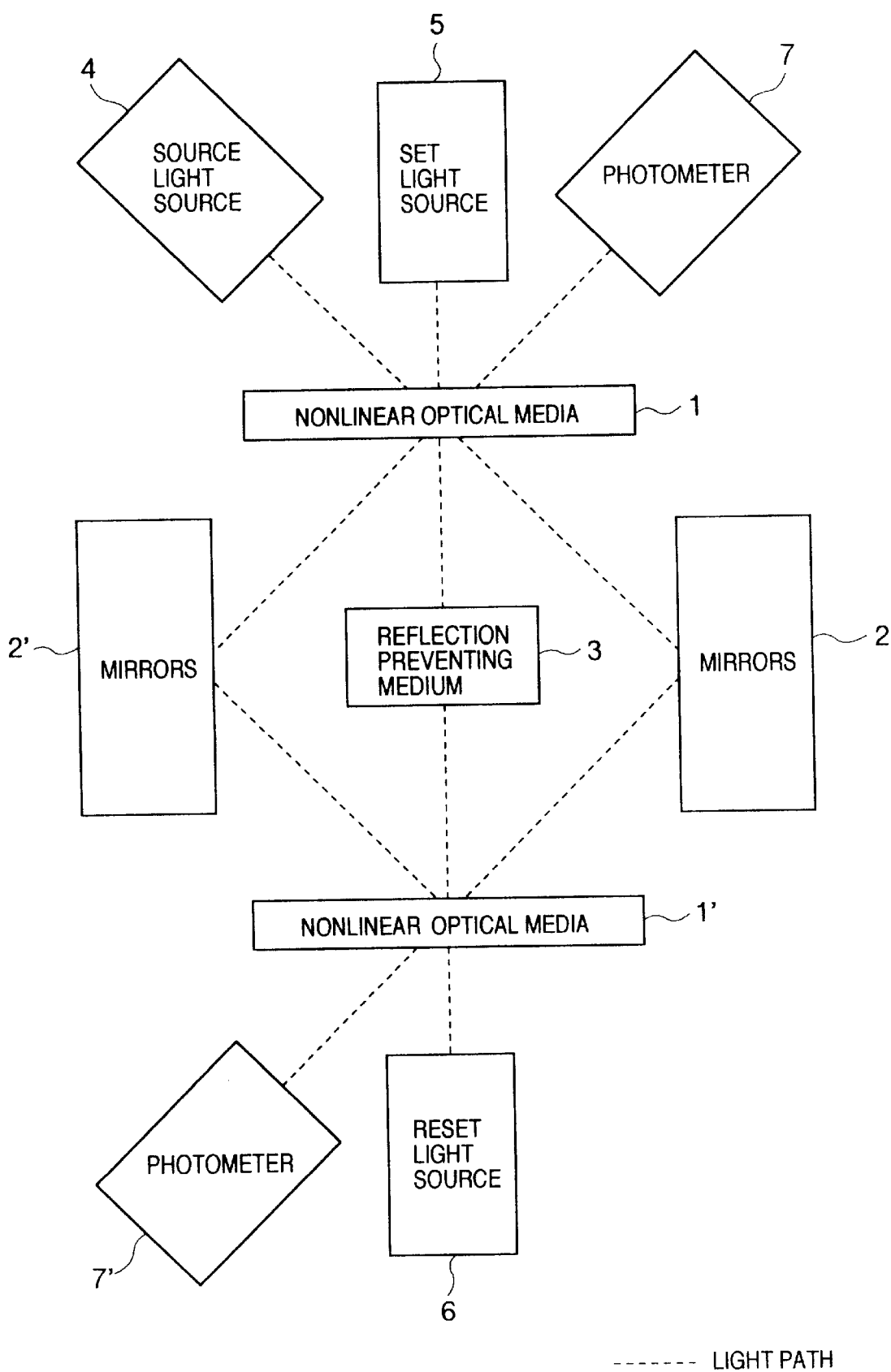
FIG. 1 is a block diagram of an optical system provided for the experiment on the operation of the optical memory device according to the invention.

FIG. 1 is a block diagram of an optical system for the experiment on the operation of the device. Two nonlinear optical media 1, 1' used are shaped in plane and arranged in parallel. In addition, two mirrors 2, 2' are provided between the nonlinear optical media. The mirror 2 reflects the light ray passed through the first nonlinear optical medium 1 into the second nonlinear optical medium 1'. The mirror 2' reflects part of the light ray reflected from the second nonlinear optical medium 1' back into the first nonlinear optical medium 1. Also, there is provided a reflection preventing medium 3 which absorbs the light rays incident perpendicularly to the first or second nonlinear optical medium and passing therethrough.

On the outside of the two nonlinear optical media are provided a source light source 4 for actuating this optical memory device, and a set light source 5 for writing light information. These light sources 4, 5 are arranged so that light can be incident slantwise and perpendicularly to the first nonlinear optical medium 1, respectively.

In addition, a reset light source 6 is provided to cause the written information to be read from the optical memory device and make the device in the state in which information can be again written in the device. The reset light source is so arranged that light can be incident perpendicularly to the second nonlinear optical medium 1'. There are also provided a photometer 7 for measuring the quantity of the reflected light of the source light from the first nonlinear optical medium 1, and a photometer 7' for measuring the quantity of the light information read from this optical memory device.

Although not shown in FIG. 1, means are separately provided for measuring the quantities of light from the source light source 4, set light source 5 and reset light source 6 themselves.

The sizes of these optical components arranged in the optical system will be mentioned below.

The nonlinear optical media which can be used may be fundamentally an arbitrary one provided that it meets the conditions concerning the response speed and the threshold in quantity of light as described later. For example, SbSI, ZnSe, and GaAs can be used as nonlinear etalon of which the response speeds are one second, ten microseconds, one nanosecond, respectively. The nonlinear optical media are not necessarily limited to these substances.

Figure 2A:
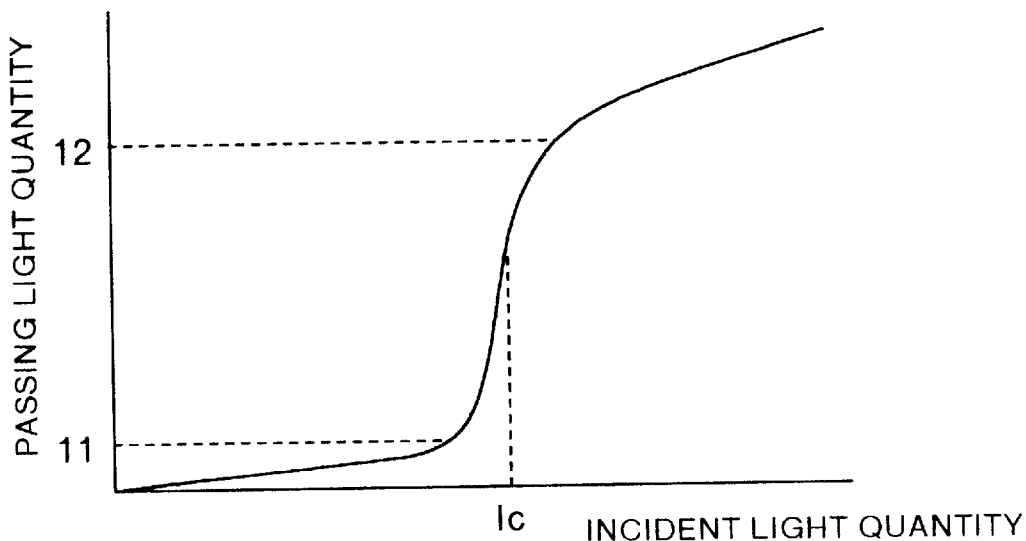
FIGS. 2A and 2B are graphs of incident light amount-passing light amount characteristics of the optical bistable media which can be used for the optical memory device of the invention.
Figure 2B:
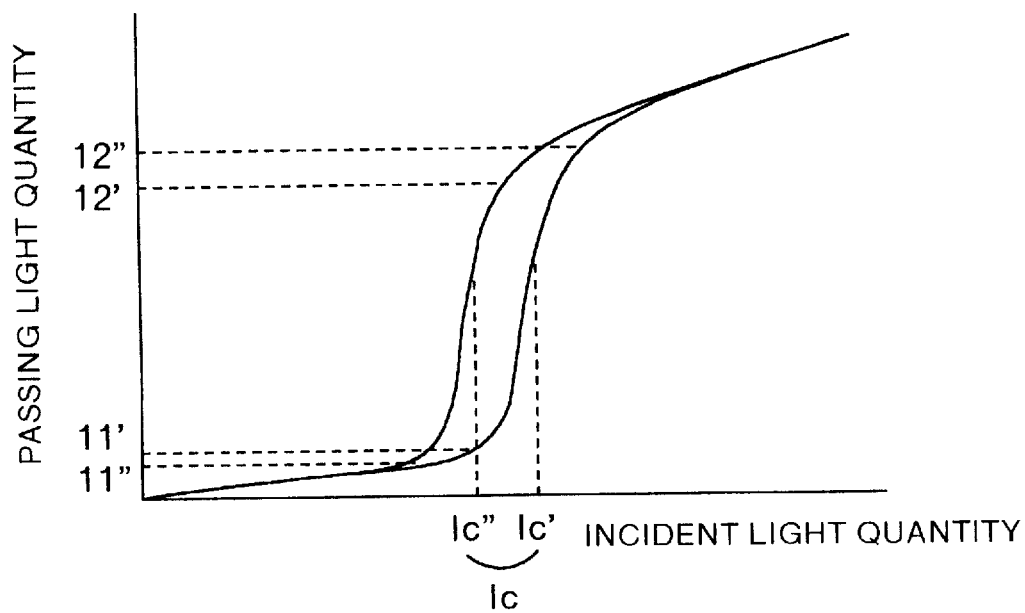

The relation between the incident light quantity and passing light quantity in the nonlinear optical media 1, 1' used here is assumed to have a positive optical bistable characteristic as, for example, shown in FIG. 2A or 2B.

In other words, as shown in FIG. 2A, the passing light quantity is almost not increased with the increase of incident light quantity until the threshold $I_c$, or the incident light is reflected the more. At around the threshold $I_c$, the passing light quantity is suddenly increased from $I_1$ to $I_2$, but when the incident light quantity is larger than the threshold, it gradually increases. In addition, when the incident light quantity is decreased from larger values than the threshold, the passing light quantity gradually decreases until the incident light quantity reaches the threshold $I_{c'}$. Then, at the threshold $I_{c'}$, the passing light quantity is suddenly decreased from $I_2$ to $I_1$, and thereafter the incident light is almost reflected.

As shown in FIG. 2B, the passing light quantity is almost not increased with the increase of incident light quantity until a threshold $I_c$, or the incident light is reflected the more. At around the threshold $I_c$, the passing light quantity is suddenly increased from $I_{1'}$ to $I_{2''}$, but when the incident light quantity is larger than the threshold, it gradually increases. When the incident light quantity is decreased from larger values than the threshold, the passing light quantity is gradually decreased until a threshold $I_{c''}$, and then it is suddenly decreased from $I_{2'}$ to $I_{1''}$ at the threshold $I_{c''}$. Thereafter, the most of the incident light is reflected.

In this case, the thresholds $I_{c'}$, $I_{c''}$ given above are assumed to indicate the range from $I_{c'}$ to $I_{c''}$ and to be represented by $I_c$ as the threshold in light quantity for nonlinear optical media in the later description. Similarly, the range from $I_{2'}$ to $I_{2''}$ is represented by $I_2$.

Moreover, a negative nonlinear optical medium, though not described here, which is suddenly changed from the initial penetrable state to the non-penetrable state when the incident light quantity is increased to around the threshold, can be realized by changing the arrangement of the following optical system components.

Furthermore, generally in most of the nonlinear optical media which exhibit optical bistability, when the passing light quantity is suddenly changed at around the threshold, the time taken for the passing light quantity to increase from $I_1$ to $I_2$ is shorter than that to decrease from $I_2$ to $I_1$, which latter case is closely related to the relaxation time of nonlinear polarization of media. Thus, in the later description, the time taken for the passing light quantity to increase is neglected, and the time necessary for the passing light quantity to decrease is taken as a response time $\tau_b$ of the nonlinear optical medium.

The method of operating this optical memory device will be described.

First, the source light is started to be incident in order to actuate this optical memory device. This source light source may be a laser light source of wavelengths necessary for this source light source, for example, a continuous-oscillation semiconductor laser or a combination of several laser devices. In this case, however, the quantity $I_{source}$ of the source light is set to the threshold $I_c$ of the first nonlinear optical medium or below. Therefore, at this time, the source light is almost reflected from the first nonlinear optical medium 1, and hence there is almost no light passing through the medium and entering into the inside of the optical memory device.

A description will be made of the method in which the set light is incident to this optical memory device and stored, or written therein. Just when the set light is made incident to the device, in which case it is so intense that the sum of the light quantity $I_{set}$ of the set light and the light quantity $I_{source}$ of the source light exceeds the threshold $I_c$ of the first nonlinear optical medium, the quantity of the light passing through the first nonlinear optical medium 1 is suddenly increased from $I_1$ to $I_2$, and as a result the source light which was almost reflected as before is conversely almost passed through the medium. Of the incident light, the set light, because of perpendicularly incident light, is passed through the nonlinear optical medium 1 and reaches the reflection preventing medium 3, where it is absorbed. The source light, because of obliquely incident light, is passed through the nonlinear optical medium 1, reflected from the mirror 2 and reaches the second nonlinear optical medium 1'. If it is assumed that the optical loss sustained during the course is neglected and that the intensity of the source light just before the incidence remains $I_{source}$, the quantity of the incident light to the second nonlinear optical medium 1' is less than the threshold $I_c$, and thus most of the incident source light is reflected. The reflected source light, after being reflected from the mirror 2', is again incident to the first optical bistable medium 1.

If is also assumed that the optical loss during the course is neglected, all the incident light to the first nonlinear optical medium 1 is the sum of the external source light and set light and the light passing through the first nonlinear optical medium 1, reflected from the second nonlinear optical medium 1' and fed back to the first nonlinear optical medium 1. The quantity of that sum light is 2 $I_{source}+I_{set}$, which is larger than the threshold $I_c$. In this case, if 2 $I_{source}$ is larger than $I_c$, the amount of the incident light to the first nonlinear optical medium 1 is larger than the threshold even if the set light is thereafter stopped from being incident, and therefore the source light continues to pass through the optical memory device. This state can be regarded as a state stored the event that the set light arrived at thisoptical memory device. In order to make this stored state, it is necessary that the set light continue to be incident for more time than the cycle time $\tau_1$ in which the source light is passed through the first nonlinear optical medium 1, reflected from the second nonlinear optical medium 1' and fed back to the first nonlinear optical medium 1. Therefore, if a light pulse of hold time, $\tau_{set}$ is used for the set light, the cycle time $\tau_1$ may be the hold time $\tau_{set}$ or below.

A description will be made of the method in which the stored state established within the optical memory device is read and the light memory device is reset so that the writable state is again brought about. It is assumed that all the amount of light incident to the second nonlinear optical medium 1', when the reset light of quantity $I_{reset}$ is irradiated on the second nonlinear optical medium 1', is $I_{reset}+I_{source}$, and equals to or larger than the threshold $I_c$ of the second nonlinear optical medium 1'. When the set light is made incident to the medium, the quantity of the light passing through the second nonlinear optical medium 1' is suddenly changed so that the set light reflected from the second nonlinear optical medium 1' as before is conversely passed through the medium and arrives at the photometer 7'. The passed reset light reaches the reflection preventing medium 3, where it is absorbed.

At that moment, the source light fed back to the first nonlinear optical medium 1 from the second nonlinear optical medium 1' is stopped. Thus, after ½ the time $\tau_1$, the source light fed back to the first nonlinear optical medium 1 is suddenly decreased, and only the external source light is incident to the first nonlinear optical medium 1. As a result, the source light entering into the optical memory device during the response time $\tau_b$ of the nonlinear optical medium is decreased, and the source light reflected from the first nonlinear optical medium 1 is increased the more. The decrease of the source light entering into the device is transmitted after another ½ the time $\tau_1$. The source light incident to the second nonlinear optical medium 1' is decreased during the response time $\tau_b$ of the nonlinear optical medium so that the passing light quantity therein is suddenly changed.

Therefore, the source light arrives at the photometer 7' during only the time, $\tau_1+2\tau_b$ from when the reset light is incident to increase the passing light quantity to when the passing light quantity is started to suddenly decrease. Thereafter, no source light is present within the optical memory device, and thus the writable state by the set light can be again brought about. In order to make this reading mode, it is necessary that the reset light continue to be incident for more time than the time $\tau_1+2\tau_b$ in which the source light can be passed through the second nonlinear optical medium 1'. Thus, if a light pulse with hold time $\tau_{reset}$ is used for the reset light, the time $\tau_1+2\tau_b$ may be $\tau_{reset}$ or below.

When the optical memory device is stopped from operation, the source light is stopped because only the set light or reset light cannot make the passing light quantity suddenly increase, so that the writing and reading operations cannot be made.

Figure 3:
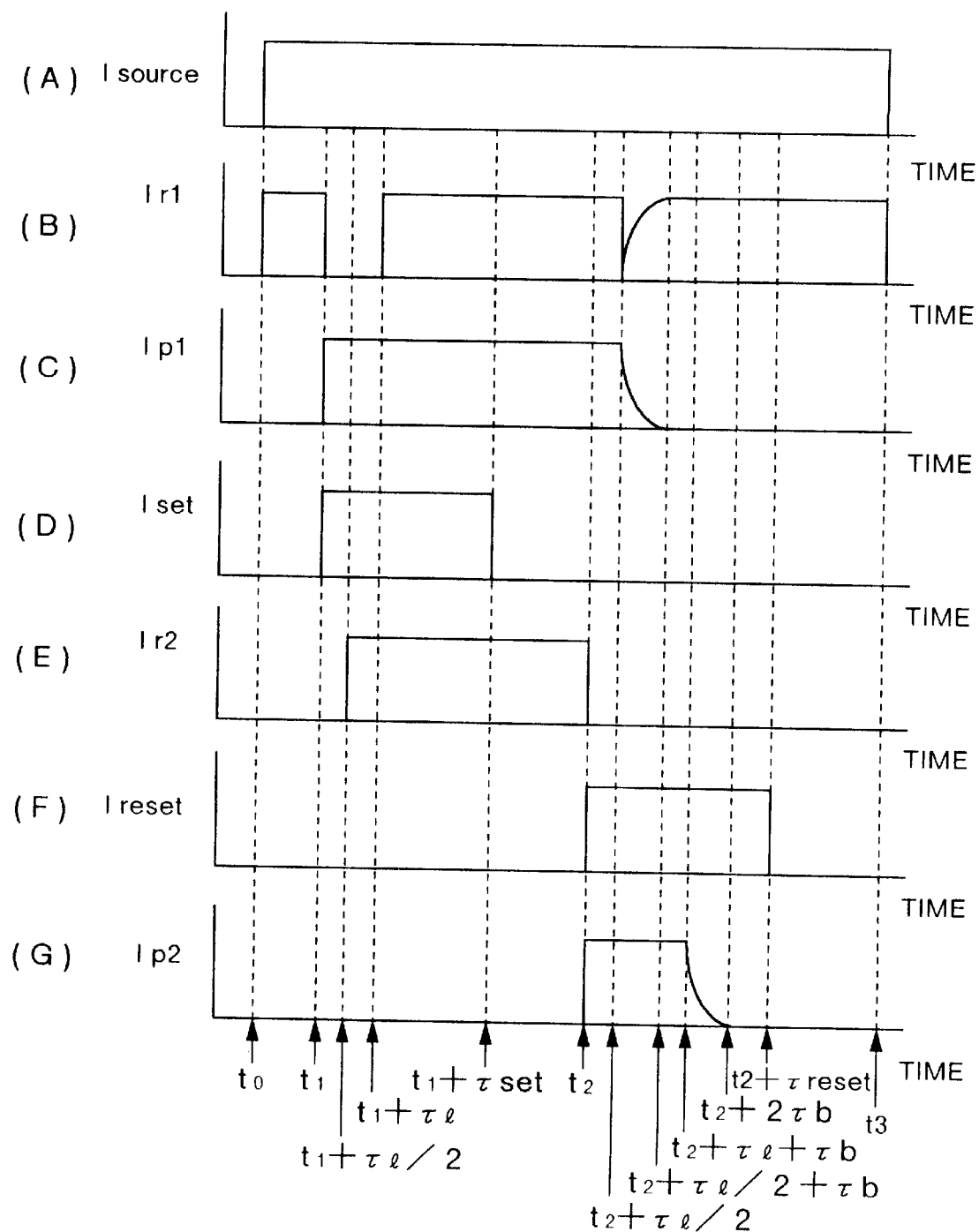
FIGS. 3(A)–(G) are timing charts of measured light amount to which reference is made in observing the experiment on the optical memory device according to this invention.

FIG. 3 is a timing chart for the operation, and writing and reading operations of the optical memory device. In FIG. 3, there are shown at (A) the source light quantity $I_{source}$, at(B) the quantity, $I_{r1}$, of source light (, or the fed back passing light quantity) reflected from the first nonlinear optical medium 1 and detected by the photometer 7, at(C) the passing source light quantity $I_{p1}$(, or the amount of light arrived at the second nonlinear optical medium 1') passing through the first nonlinear optical medium 1, at(D) the set light quantity $I_{set}$, at (E) the reflected source light quantity $I_{r1}$ from the second nonlinear optical medium (, or the fed back light quantity to the first optical bistable medium 1), at (F) the reset light quantity $I_{reset}$ and at (G) the passing source light quantity $I_{p2}$ passing through the second nonlinear optical medium and detected by the photometer 7'.

Referring to FIG. 3, when the source light starts to be incident at time $t_0$, actuating the device, the reflected light from the first nonlinear optical medium 1 increases, but there is no passing light in the medium. Then, the set light is started to be irradiated on the medium at time $t_1$, the passing light in the first nonlinear optical medium 1 increases, but the amount of the reflected light becomes zero. At time $t_1+\tau_1 2$, the passing set light arrives at and started to be reflected from the second nonlinear optical medium 1'. At time $t_1+\tau_1$, the reflected set light is fed back to the first nonlinear optical medium 1, passed therethrough and enters into the light path into which the source light was reflected from the medium before the set light is incident thereto, so that the light arriving at the photometer 7 again increases. At time $t_1+\tau_{set}$, the set light is reduced to zero, but the source light does not change its path.

Then, at time $t_2$, the reset light starts to be incident to the second optical bistable medium 1', the source light starts to pass through this medium, and at the same time it stops from being reflected. At time $t_2+\tau_1/2$, no source light is fed back to the first nonlinear optical medium 1, and thus at that moment the light reaching the photometer 7 is reduced to zero. Thereafter, the set light passing the medium is gradually reduced during the response time $\tau_b$, but instead the reflected light therefrom is increased. At time $t_2+\tau_1$, the light incident to the second nonlinear optical medium 1' also starts to be reduced, and at about $t_2+\tau_1+2\tau_b$, the light passing therethrough disappears. At time $t_2+\tau_{reset}$, the reset light is reduced to zero. When writing and reading operations are again performed, the same operations are repeated. To stop the operation, the source light is turned off at, for example, time $t_3$.

Therefore, the conditions necessary for executing a series of these optical memory functions can be given as follows:

I source<I c, I set<I c, I reset<I c

2 I source>Ic, I source+I set>I c, I source+I reset>I c,

τ b<τ1, τ set>τ 1, τ reset>τ 1+2 τ b

At this time, the duration of the source light arriving at the photometer 7' is $\tau_1+2\tau_b$. $\tau_{set}$ and $\tau_{reset}$ are determined by the pulse widths of the set light and reset light used, respectively. $\tau_b$ is determined by the kind of the nonlinear optical medium. $\tau_1$ corresponds to the time in which the source light is first passed through the first nonlinear optical medium 1 of the optical memory device, reflected from the second nonlinear optical medium 1' and fed back to the first nonlinear optical medium 1, or the cycle time in which the light once runs that cyclic distance.

Thus, the following relation can be established:

(cycle time $\tau_1$)=(cyclic distance)×(refractive index of cycle interval)÷(velocity of light)

If optical systems of sizes 1 m, 1 mm, 1 μm are built up in the air in which the light velocity is 3×10$^8$ m/s, the cycle times $\tau_1$ for each system are about 3 ns, 3 ps, 3 fs, respectively. If we use a GaAs nonlinear etalon of which the response speed is in the order of nanoseconds as a nonlinear optical medium, and light pulses of nanoseconds as the set light and reset light because the size of an optical system which can be built up in the air is at most several centimeters, a light pulse corresponding to about $\tau_b$ can be taken out as a readout light ray.

In addition, if an optical system of several-μm size is built up by using nonlinear optical media of which the response is higher than the organic superlattice or the like and by means of photolithography or other means, optical pulses of shorter duration can be derived by set light and reset light of about nanoseconds.

Embodiment 2

A description will be made of a method of using a plurality of synchronized optical memory devices.

Figure 4:
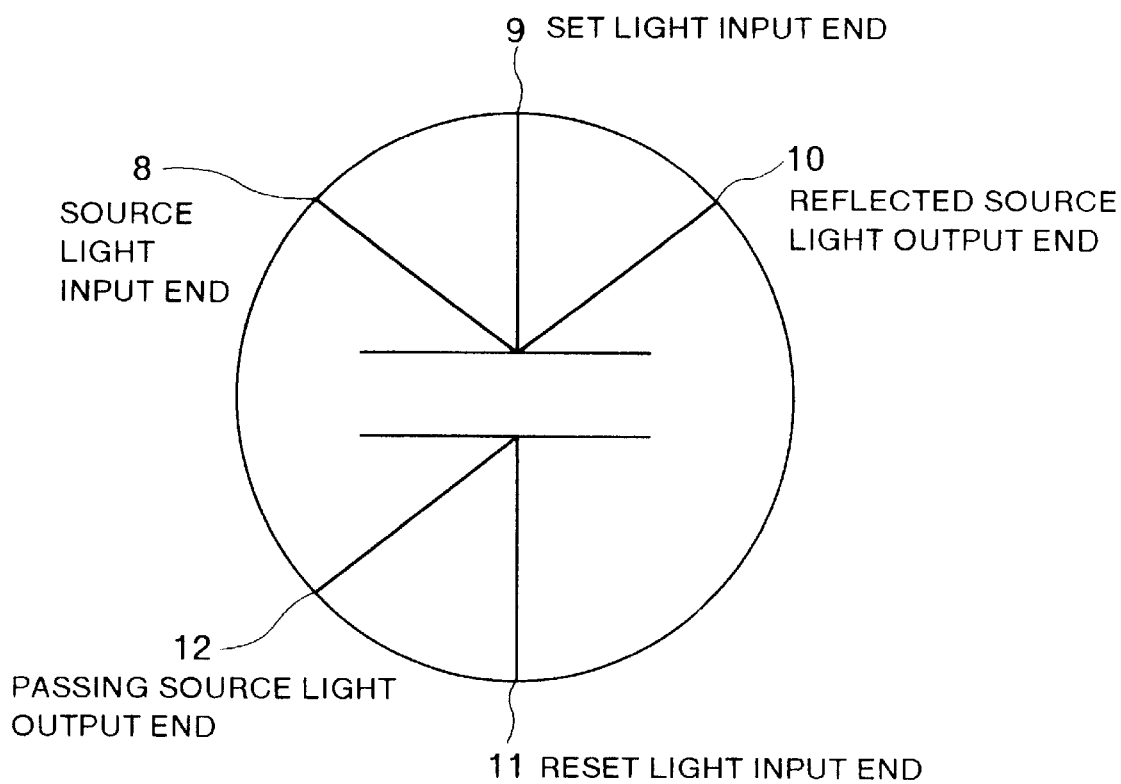
FIG. 4 is a schematic view of the memory device of the invention.

The optical memory device given in the following description is schematically shown in FIG. 4. In other words, the optical memory device is surrounded by a circle in FIG. 4. Two nonlinear optical media are represented by two parallel lines at the center. In addition, one ends of five light paths are connected to those media, and the other ends of the paths along the circle are indicated by numerals 8, 9, 10, 11 and 12 and serve as source light input point, set light input point, reflected source light output point, reset light input point and passing source light output point, respectively.

Figure 5:
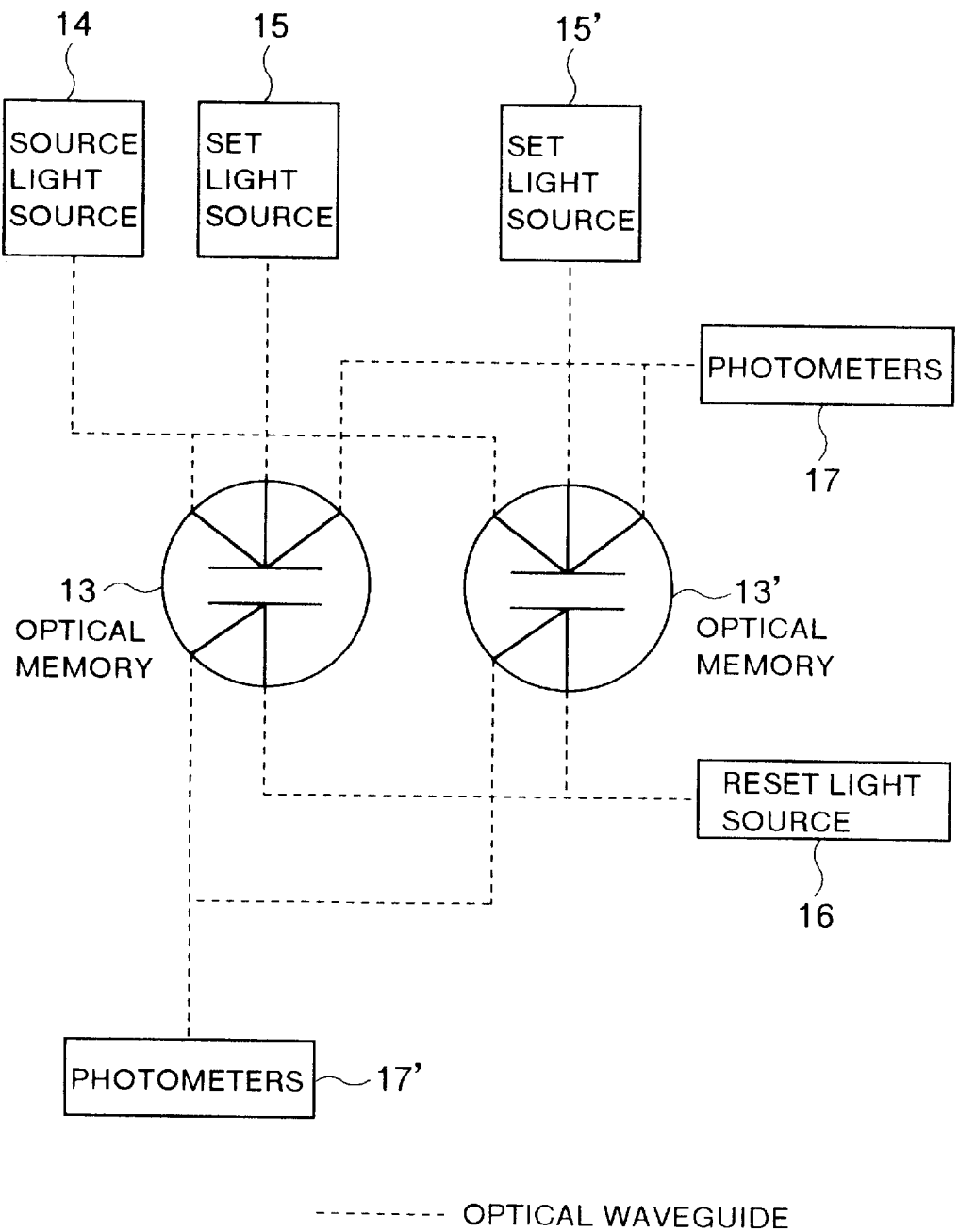
FIG. 5 is a block diagram of an optical system provided for the experiment on the synchronization between the two optical memory devices of the invention.

A description will be first made of a method of taking out signals from the two optical memory devices synchronized with each other. FIG. 5 is a block diagram of the arrangement of an optical system using the two optical memory devices. Referring to FIG. 5, there are shown two optical memory devices 13, 13', one source light source 14, two set light sources 15, 15', and one reset light source 16. The reflected source light rays from the two optical memory devices are collected into one photometer 17, and the passing light rays from the two optical memory devices into one photometer 17'. Here, the hold time of both the set light and reset light is represented by $\tau_h$. The response time $\tau_b$ and cycle time $\tau_1$ of the nonlinear optical media in the optical memory devices are both assumed to be much shorter than $\tau_h$.

Therefore, the duration $\tau_p=\tau_1+2\tau_b$ of the passing source light rays taken out of the optical memory devices is also shorter than $\tau_h$. The reason for these situations is that light pulses of nanoseconds synchronized with an electric signal are used for the set light and reset light so that the optical memory devices can be driven in the order of picoseconds. The respective optical components are connected by optical waveguides. The two optical memory devices are connected so that the reset light is incident to both memory devices at a time. The passing source light rays simultaneously exiting from the two memory devices are shifted by a time difference of $2\tau_p$ from each other during running through the connection lines and mixed together at the photometer 17'.

Figure 6:
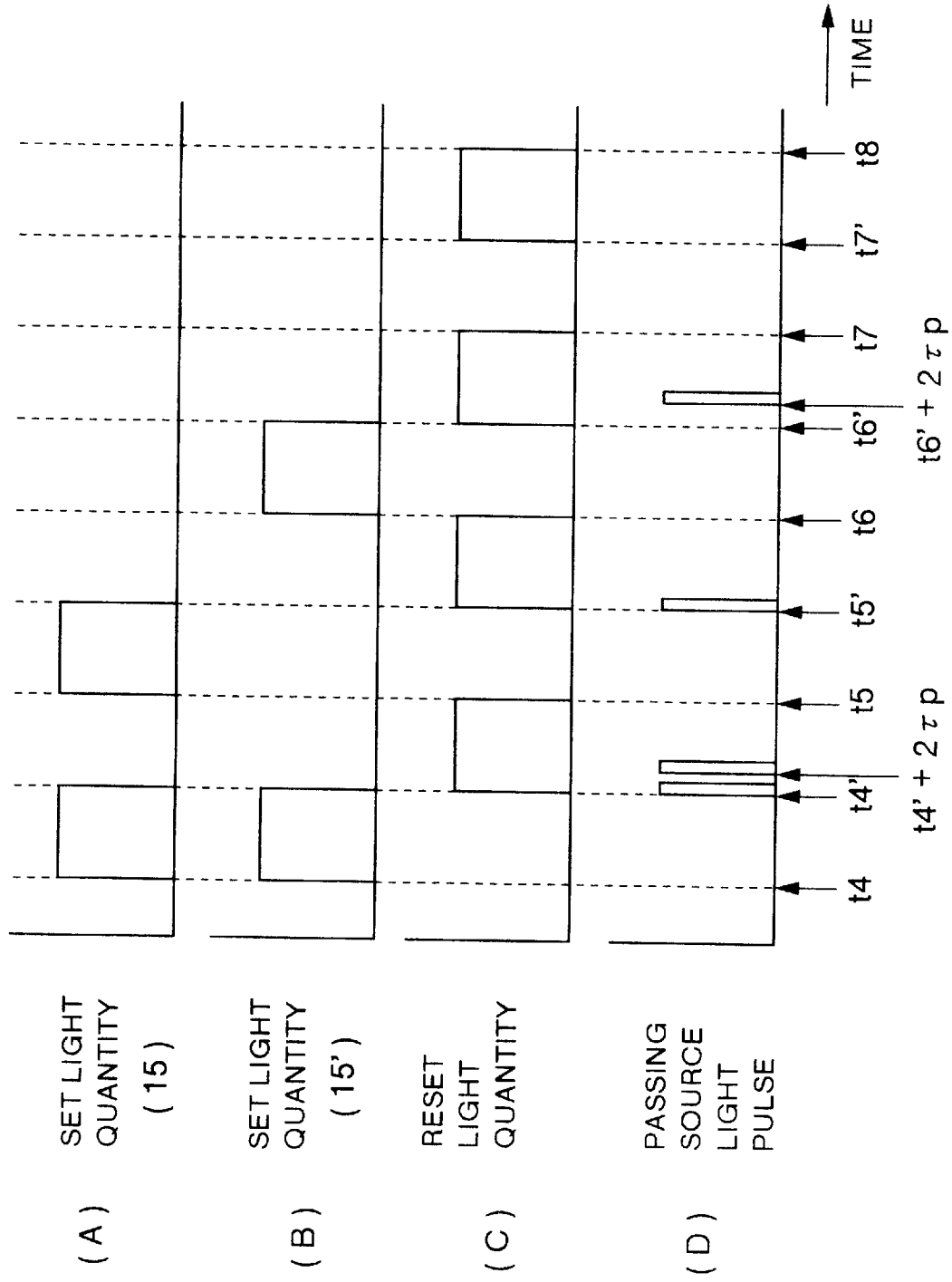
FIGS. 6(A)–(D) are timing charts of measured light amount to which reference is made in observing the experiment on the synchronization between the two optical memory devices of the invention.

FIG. 6 is a timing chart for the light quantities in the two set light sources 15, 15', one reset light source 16 and one photometer 17' which are used with the synchronized optical memory devices. Although particularly not described here, it is assumed that the source light is already started to be fed to the optical memory devices. Referring to FIG. 6, at time $t_4$, the set light pulses are fed from the separate light sources to write the memory devices. At time $t_4'$, when the reset pulse is incident to the devices, the passing source light pulses (pulse width of $\tau_p$) are read from the two optical memory devices and appear at times $t_4'$, $t_4'+2\tau_p$, respectively. Thus, a train of two light pulses shorter than the light pulses from the two light sources arrives at the single photometer 17'. When only the optical memory device 15 is set at time $t_5$ and reset at time $t_5'$, a single passing source light pulse is generated at time $t_5'$. In addition, when only the optical memory device 15' is set at time $t_6$ and reset at time $t_6'$, a single passing source light pulse is generated at time $t_6'+2\tau_p$. Unless both the memory devices 15, 15' are set at time $t_7$, no passing source light pulse appears even if resetting is made at time $t_7'$.

Figure 7:
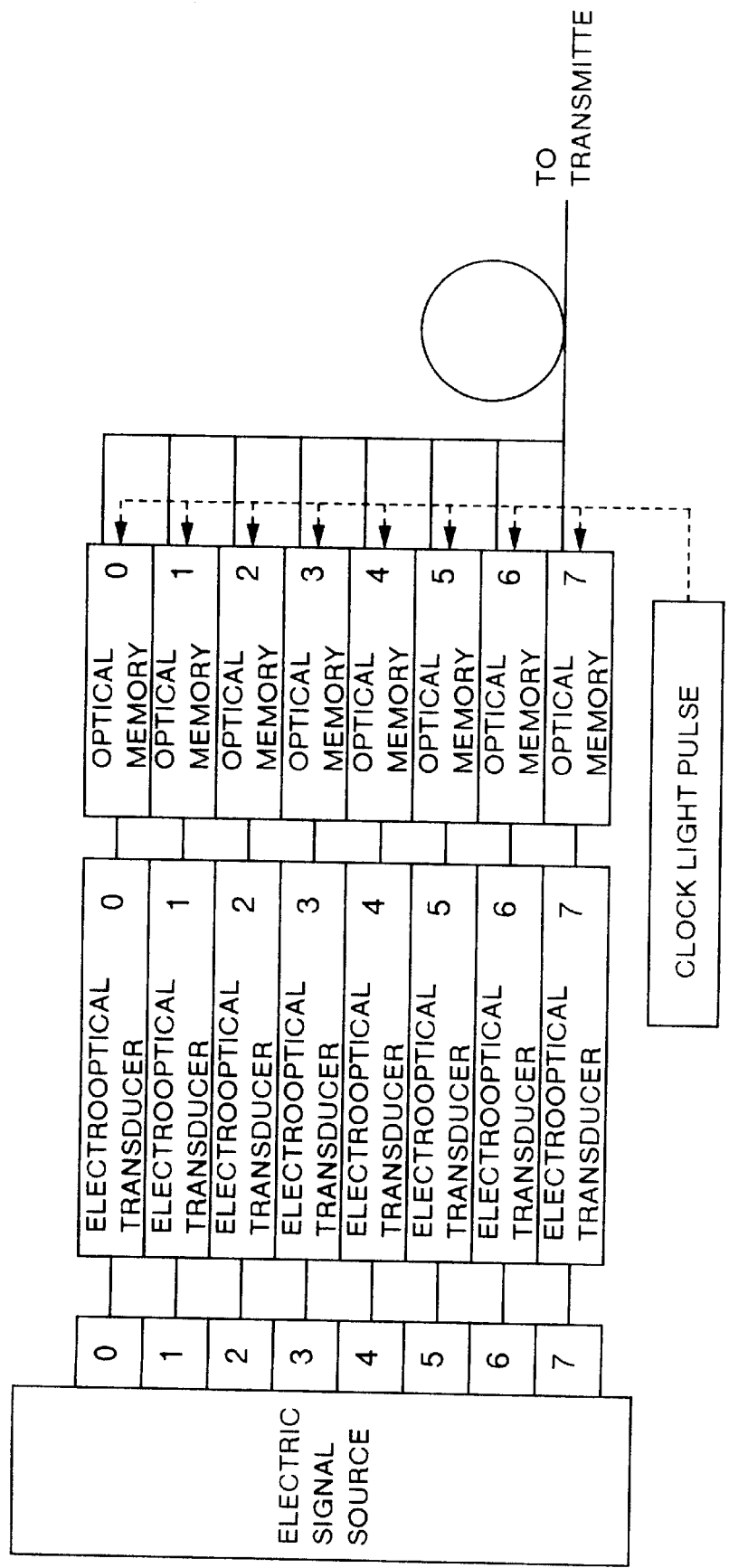
FIG. 7 is a block diagram of an 8-bit signal transmitter using optical memory devices according to this invention.

FIG. 7 is a block diagram of a system for transmitting an 8-bit electric signal as a series of light pulses. The bits of the 8-bit electric signal are fed from the eight ports 0 through 7 of an electric signal source through electric cables to an optical transmitter. The eight electric cables are connected to electrooptical converters, where light pulses are generated in accordance with the presence or absence of electric signal. The electrooptical converters may be semiconductor lasers or electrooptical transducers, but the width of the pulses generated therefrom is in the order of several nanoseconds. If this generated pulse is once stored in the optical memory device of the invention and if a single clock optical pulse is used as reset light for each optical memory device, a train of shorter pulses with a constant interval can always be transmitted through a single optical fiber to the outside.

In other words, the 8-bit electric signal can be transmitted as a set of light pulse trains through a single optical fiber. The electric signals from a plurality of electric signal sources can be similarly converted into shorter light pulse trains than a plurality of set light pulses by connecting more optical memory devices in parallel.

For example, 10 electric signal trains of nanoseconds which have so far been separately transmitted through 10 optical fibers can now be transmitted through a single optical fiber, and thus 100 electric signal trains can be transmitted through 10 optical fibers.

Embodiment 3

A description will be made of an example of using the optical memory device of the invention to make various different optical logic operations. For optical logic operation, logic operators can be constructed by a combination of nonlinear optical media.

Figure 8:
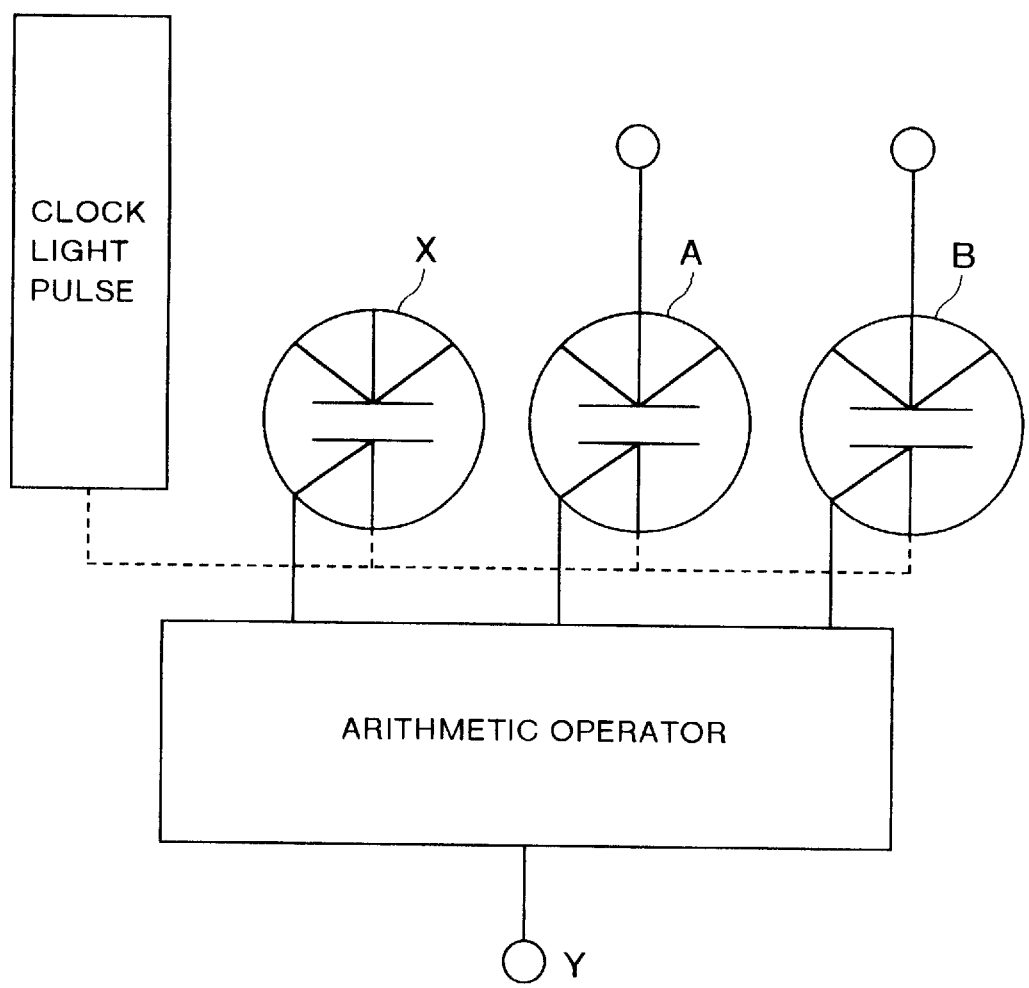
FIG. 8 shows a basic construction of an optical logic operating device using optical memory devices of the invention.

FIG. 8 shows one example of the basic construction of the logic operating device. Here, the logic operating device is formed of two optical memory devices A, B for input signal, one optical memory device X for output signal, a logic circuit for making logic operation in accordance with the light pulses from these optical memory devices, and an output portion Y for the result of logic operation.

In the logic operation using light pulses, the presence and absence of light pulse are defined as true state, 1 and false state, 0, respectively. The logic circuit makes logic operation in accordance with the presence or absence of signal to the optical memory devices for input signal. If the input signals are ultra short light pulses of picoseconds or below, a plurality of input signals must be timely supplied to the logic circuit.

Thus, to make logic operation without error, two input signals are once stored in the input optical memory devices, and they are synchronized and supplied to the logic circuit.

FIG. 9 shows one example of logic circuits and logic operation table. The fundamentals for the logic operations are "A (affirmative)", "not A (negation)", "A or B(disjunction)", "A and B(conjunction)", "B if A(conditional)" and so on. These fundamental operations can be realized by a combination of nonlinear optical media optically arranged on the basis of the types of the operations.

For example, "A (YES)" is the operation for making the true and false of A appear at Y as it is, and "not A(NOT)" is the operation for making the true and false of A appear false and true at Y. These operations can be realized by using the bistable phenomenon that the transmissivity is suddenly increased when the sum of the input light rays A and X to the nonlinear optical medium X exceeds the threshold.

The logic operation of two input signals A and B such as "A or B (SUM)", "A and B (PRODUCT)" and "B if A (CARRY)" can be performed by a combination of two optically bistable media. The other various, more complex operations can also be carried out by a combination of a plurality of nonlinear optical media. In either case, it is necessary to timely introduce input signals, and thus for this purpose, another optical memory device is required.

What is claimed is:

1. An optical memory device having at least two nonlinear optical media E and F and at least two light paths for connecting said nonlinear optical media E and F, comprising:
   a first incident light for driving said optical memory device;
   a second incident light for writing said first incident light into said optical memory device,
   a third incident light for reading out the written information in said optical memory device, wherein said first and second incident lights are incident to said nonlinear optical media E and said third incident light is incident to said nonlinear optical media F.

2. An optical memory device according to claim 1, wherein the length of said light paths connecting said nonlinear optical media is 1 m or less.

3. An optical memory device according to claim 1, wherein the length of said light paths connecting said nonlinear optical media is variable.

4. An optical circuit comprising at least two optical memory devices according to claim 1.

5. An optical circuit comprising at least two optical memory devices according to claim 1, said optical memory devices being connected by light paths.

6. An optical circuit comprising at least two optical memory devices according to claim 1, said optical memory devices being started in operation, written to, read from and erased of information using moveable light sources.

7. An optical circuit having a plurality of optical memory devices according to claim 1 formed on a single substrate.

8. An optical transmitter comprising:
   a device for converting at least two external electric signals into light signals;
   an optical memory device according to claim 1 to temporarily store said light signals; and
   a device for mixing light signals which are synchronously read from said optical memory device and supplying them to the outside.

9. An optical receiver comprising:
   a device for dividing an external light signal train into at least two light signals;
   an optical memory device according to claim 1 to temporarily store said light signals; and
   a device for converting light signals synchronously read from said optical memory device into electrical signals and supplying them to the outside.

10. An optical computer having an optical memory device according to claim 1 and an optical logic operator.

11. A display device having an optical memory device according to claim 1, and a light-emitting device.

12. An optical memory device having at least two nonlinear optical media E and F connected together by at least two light paths, wherein said nonlinear optical media exhibit optical bistability, and if a threshold of one nonlinear optical medium E is represented by $I_{c1}$, a threshold of another nonlinear optical medium F by $I_{c2}$, an amount of information light incident to said nonlinear optical medium E of said optical memory device by $I_{set}$, an amount of driving light incident to said nonlinear optical medium E of said optical memory device by $I_{source}$, an amount of light exiting from said medium E and then incident to said nonlinear optical medium F by $I_{source1}$, an amount of light incident to said nonlinear optical medium F, exiting from said medium F and then incident to said nonlinear optical medium E by $I_{source2}$, and an amount of reading light incident to said nonlinear optical medium F to read said written information from said optical memory device by $I_{reset}$, the following conditions can be established:

$I_{c1} > I_{source}$, $I_{c1} > I_{set}$, $I_{c1} > I_{source2}$, $I_{source} + I_{set} \geq I_{c1}$, $I_{source} + I_{source2} \geq I_{c1}$ $I_{c2} > I_{source1}$, $I_{c2} > I_{reset}$ $I_{source1} + I_{reset} \geq I_{c2}$.

* * * * *